US006710412B2

(12) United States Patent
Tsukamoto et al.

(10) Patent No.: US 6,710,412 B2
(45) Date of Patent: Mar. 23, 2004

(54) STATIC SEMICONDUCTOR MEMORY DEVICE

(75) Inventors: Yasumasa Tsukamoto, Hyogo (JP); Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/361,769

(22) Filed: Feb. 11, 2003

(65) Prior Publication Data

US 2004/0036088 A1 Feb. 26, 2004

(30) Foreign Application Priority Data

Aug. 21, 2002 (JP) ........................ 2002-240692

(51) Int. Cl.[7] .................. H01L 29/76; H01L 29/94; H01L 31/062; H01L 31/113; H01L 31/119
(52) U.S. Cl. .................. 257/369; 257/368; 257/382; 257/903
(58) Field of Search ................... 257/368, 369, 257/382, 903, 904

(56) References Cited

U.S. PATENT DOCUMENTS 5,703,392 A * 12/1997 Guo .................. 257/392
5,965,922 A    10/1999 Matsui
2001/0052624 A1 * 12/2001 Houston .................. 257/390

FOREIGN PATENT DOCUMENTS

JP        10-125803        5/1998

OTHER PUBLICATIONS

Noda, K. et al.; "A 1.9–$\mu m^2$ Loadless CMOS Four–Transistor SRAM Cell in a 0.18 $\mu m$ Logic Technology", *Intl. J. IEDM*, pp. 643–646, (1998).
Noda, K. et al.; "An Ultrahigh–Density High–Speed Loadless Four–Transistor SRAM Macro with Twisted Bitline Architecture and Triple–Well Shield", *Intl. J. IEEE JSSC*, vol. 36, No. 3, pp. 510–513, (Mar. 2001).

* cited by examiner

*Primary Examiner*—Ngân V. Ngô
(74) *Attorney, Agent, or Firm*—Leydig, Voit & Mayer, Ltd.

(57) ABSTRACT

An SRAM includes first and second access PMOS transistors in an N well region; first and second driver NMOS transistors in a P well region; a word line; and first and second bit lines. Active regions extend in the same direction, polysilicon wirings for forming gates of each of the MOS transistors extend in the same direction, and drains of the first and second access PMOS transistors are connected to drains of the first and second driver NMOS transistors using first metal wirings without interposing the polysilicon wirings forming the gates of the first and second driver NMOS transistors therebetween, respectively.

11 Claims, 9 Drawing Sheets

STATIC SEMICONDUCTOR MEMORY DEVICE

BACKGROUND OF THE INVENTION

1. Field of the Invention

The present invention relates to a static semiconductor memory device (hereinafter, referred to as "SRAM (Static Random Access Memory)"), and more particularly to a memory cell structure of a CMOSSRAM.

2. Description of the Background Art

FIG. 14 shows the conventional layout configuration of a non-load SRAM memory cell formed from four tansistors. FIG. 12 is an equivalent circuit diagram of FIG. 14.

The SRAMs of this type are described in, for example, "A 1.9-$\mu m^2$ Loadless CMOS Four-Transistor SRAM Cell In a 0.18-$\mu m$ Logic Tecnology", international journal IEDM '98, pp. 643–646 and "An Ultrahigh-Density High-Speed Loadless Four-Tristor SRAM Macro with Twisted Bit Line Architecture and Triple-Well Shield", international journal IEEE JSSC VOL. 36, No. 3, March 2001.

As shown in FIG. 14, a memory cell 1 includes four MOS (Metal Oxide Semiconductor) transistors. Specifically, memory cell 1 includes NMOS transistors N1 and N2 in a P well and PMOS transistors P1 and P2 in an N well.

NMOS transistor N1 is located at an intersection between an N-type diffusion region 2a and a polysilicon wiring 3c, and NMOS transistor N2 is located at an intersection between an N-type diffusion region 2b and a polysilicon wiring 3b. PMOS transistor P1 is located at an intersection between a P-type diffusion region 2c and a polysilicon wiring 3a, and PMOS transistor P2 is located at an intersection between a P-type diffusion region 2d and a polysilicon wiring 3a.

PMOS transistors P1 and P2 are access transistors and NMOS transistors N1 and N2 are driver transistors. Diffusion regions 2a to 2d are connected to upper layer wirings through contact holes 4a to 4h, respectively.

With the layout configuration shown in FIG. 14, a word line WL is arranged in a lateral direction while bit line pairs BL1 and BL2 are arranged in a longitudinal direction. As shown in FIG. 14, the layout configuration of one bit is long in the longitudinal direction and a bit line, therefore, becomes long in this configuration. In addition, high resistance polysilicon wirings 3b and 3c are present on the path (path for pulling out bit lines) between a bit line and a GND line.

As described above, since the conventional four-transistor SRAM memory cell is long in a bit line direction, the wiring capacitance of each bit line is high. Due to this, access time is slow. Further, since high resistance polysilicon wirings 3b and 3c are present on the paths between bit line contact sections (contact holes 4f and 4h) and ground contact sections (contact holes 4a and 4c), respectively, the resistance of each path is high. The high resistance of the path also causes a delay in access time, disadvantageously hampering increasing the see of the SRAM.

Furthermore, the direction of the gates and diffusion regions of access transistor and P2 differ from that of the gates and diffusion regions of driver transistors N1 and N2. Due to this, variations in the widths and positions of formation patterns for gates or the like become large after photolithographic processing. If variations in gate width and the like become large, the characteristics of the respective tranistors disadvantageously change.

Moreover, if the position at which polysilicon wiring 3c is formed is deviated horizontally, for example, in FIG. 14, a short circuit is generated between polysiicon wiring 3c and contact hole 4a or 4b. If the position at which polysilicon wiring 3a is formed is deviated vertically, for example, in FIG. 14, a shortcuit is generated between polysilicon wiring 3a and contact holes 4e to 4h. As can be seen, even if a gate pattern is deviated either vertically or horizontally, a short-circuit may possibly be generated between the polysilicon wiring and the contact hole which should be separated from each other, making it disadvantageously difficult to secure a margin for manufacturing irregularities caused by a mask error or the like.

SUMMARY OF THE INVENTION

The present invention has been achieved to solve the above described disadvantages. It is an object of the present invention to accelerate an SRAM and to secure a manufacturing irregularity margin.

According to one aspect of the present invention, a static semiconductor memory device includes: first and second bit lines; a word line; first and second access MOS transistors of a first conductive type, having sources connected to the first and second bit lines, respectively, and having gates connected to the word line in common; and first and second driver MOS transistors of a second conductive type different from the first conductive type, having sources applied with a ground potential, having drains connected to drains of the first and second access MOS transistors, respectively, and having gates connected to the drains of the second and first access MOS transistors, respectively. The drain of the first access MOS transistor is connected to the drain of the first driver MOS transistor by using a metal wiring without interposing a gate of the second driver MOS transistor therebetween, and the drain of the second access MOS transistor is connected to the drain of the second driver MOS transistor by using a metal wiring without interposing a gate of the first driver MOS transistor therebetween.

As can be seen, an access MOS transistor is connected to each driver MOS transistor by using a metal wiring lower in r than an ordinary gate without interposing the gate of the other driver MOS transistor therebetween. It is, therefore, possible to decrease the resistance between the bit line and the ground line. It is thereby possible to accelerate an SRAM.

According to another aspect of the present invention, a static semiconductor memory device includes: first and second access MOS tranistors of a second conductive type, formed on a first well of a first conductive type; first and second driver MOS transistors of the first conductive type, formed on a second well of the second conductive type; a word line connected to gates of the first and second access MOS transistors, and extending in a direction in which the first and second wells are aligned; and first and second bit lines connected to sources of the first and second access MOS transistors, respectively, and extending in a direction perpendicular to the direction in which the first and second wells are aligned First and second diffusion regions of the second conductive type for forming sources and drains of the first and second access MOS transistors are extended in a same direction as a direction in which third and fourth diffusion regions of the first conductive type for forming sources and drains of the first and second driver MOS transistors are extended, gates of the first and second access MOS transistors are extended in a same direction as a direction in which gates of the first and second driver MOS transistors are extended, and the drains of the first and second access MOS transistors are connected to the drains of the first and second driver MOS transistors by using first and second metal wirings without interposing the gates of the first and second driver MOS tranistors therebetween, respectively.

As described above, by connecting the drain of an access MOS transistor to the drain of a driver MOS transistor by using a metal wiring without interposing the gate of the driver MOS tansistors therebetween, it is possible to avoid interposing a polysilicon wiring on the path between these drains. It is thereby possible to decrease the resistance of the path. In addition, since the bit lines are extended in the direction perpendicular to the direction in which the first and second wells are aligned, it is possible to reduce the length of each bit line. Further, since the first, second, third and fourth diffusion regions (active regions) are extended in the same direction and the gate of an access MOS transactor is extended in the same direction in which the gate of a driver MOS transistor is extended it is possible to decrease vacations in the width and positions of formation patterns for gates or the like after photolithography. Besides, even if each gate is deviated in the extension direction longitudinal direction) thereof, it is possible to avoid short-circuits between the gate and the contact holes provided on the both sides thereof in the width direction. That is, it is possible to allow the gate to be shifted in the longitudinal direction to some extent.

It is preferable to provide a fist contact section reaching the gate of the first driver MOS transistor and the drain of the second driver MOS transistor, and to provide a second contact section reaching the gate of the second driver MOS transistor and the drain of the first driver MOS transistor. That is, it is preferable to provide shared contact sections between the gates and drains of the driver MOS transistors.

The first and second access MOS transistors may be arranged to be aligned in the direction in which the word line is extended. In addition, the second metal wiring may be formed from a metal wiring on a layer above the first metal wiring.

It is preferable that an area of each of the drains of the first and second driver MOS transistors is made smaller than an area of each of the sources of the first and second driver MOS transistors. For example, if an SRAM includes first and second wirings for forming the gates of the first and second driver MOS transistors, the gates of the first and second driver MOS tranistors may be arranged on the drain side of the first and second driver MOS transistors by bending the first and second wirings.

It is preferable that a gate length of each of the first and second driver MOS transistors is made longer than a gate length of each of the first and second access MOS transistors. For example, if an SRAM includes first and second wirings for forming the gates of the first and second driver MOS tansistors, a gate length of each of the first and second driver MOS trans s can be made longer than a gate length of each of the first and second access MOS transistors by locally expanding widths of the first and second wiring.

According to still another aspect of the present invention, a static semiconductor memory device includes: a first well of a second conductive type, formed between second and third wells of a first conductive type; first and second access MOS transistors of the second conductive type, formed on the second well; first and second driver MOS transistors of the first conductive type, formed on the first well; third and fourth access MOS transistors of the second conductive type, formed on the third well; a first word line connected to gates of the first and second access MOS transistors, and extending in a direction in which the first, second and third wells are aligned; a second word line connected to gates of the third and fourth access MOS transistors, and extending in the direction in which the first, second and third wells are aligned; first and second bit lines connected to sources of the first and second access MOS transistors, respectively, and extending in a direction perpendicular to the direction in which the first, second and third wells are aligned; and third and fourth bit lines connected to sources of the third and fourth access MOS transistors, respectively, and extending: in the direction perpendicular to the direction in which the first, second and third wells are aligned. First, second, third and fourth diffusion regions of the second conductive type, for forming the sources and drains of the first, second, third and fourth access MOS tansistors are extended in the same direction as a direction in which fifth and sixth diffusion regions of the first conductive type, for forming sources and drains of the first and second driver MOS transistors are extended, the gates of the first, second, third and fourth access MOS transistors are extended in the same direction as a direction in which gates of the first and second driver MOS transistors are extended, and the drains of the first, second, third and fourth access MOS transistors are connected to the drains of the first and second driver MOS transistors by using first and second metal wirings without interposing the gates of the first and second driver MOS tranitors therebetween, respectively.

Even in case of such an SRAM including 2-port memory cells according to this aspect, the drain of an access MOS transistor is connected to the drain of a driver MOS transistor by using a metal wiring without interposing the gate of the driver MOS transistor therebetween It is, therefore, possible to avoid interposing a polysilicon wiring on a path between these drains and to decrease the resistance of the path. In addition, since the bit lines are extended in the direction perpendicular to the direction in which the first to third wells are aligned, it is possible to reduce the length of each bit line. Further, since the first to sixth diffusion regions (active regions) are extended in the same direction and the gate of an access MOS transistor is extended in the same direction in which the gate of a driver MOS transistor is extended, it is possible to decrease variations in the width and positions of formation patterns for gates or the like after photolithography. Besides, it is possible to allow the gate to be shifted in the longitudinal direction to some extent.

It is preferable that the first and second bit lines are formed on the second well, and that the third and fourth bit lines are formed on the third well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to FIGS. 1 to 13.

First Embodiment

Figure 1:
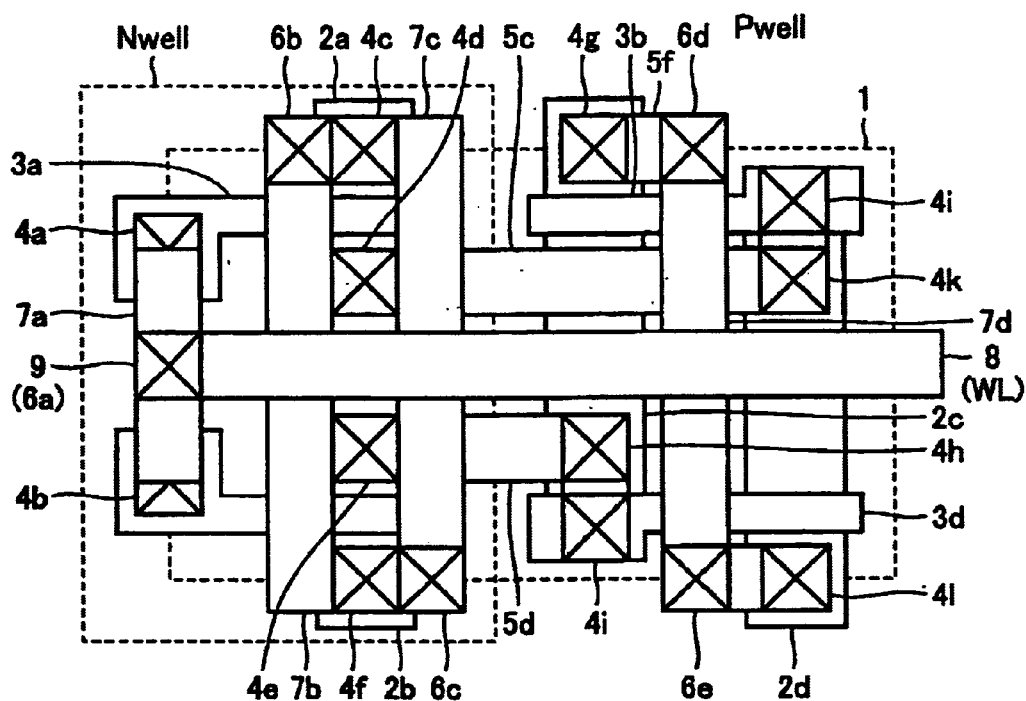
FIG. 1 shows a layout configuration of a non-load SRAM memory cell according to a first embodiment of the present invention.
Figure 2:
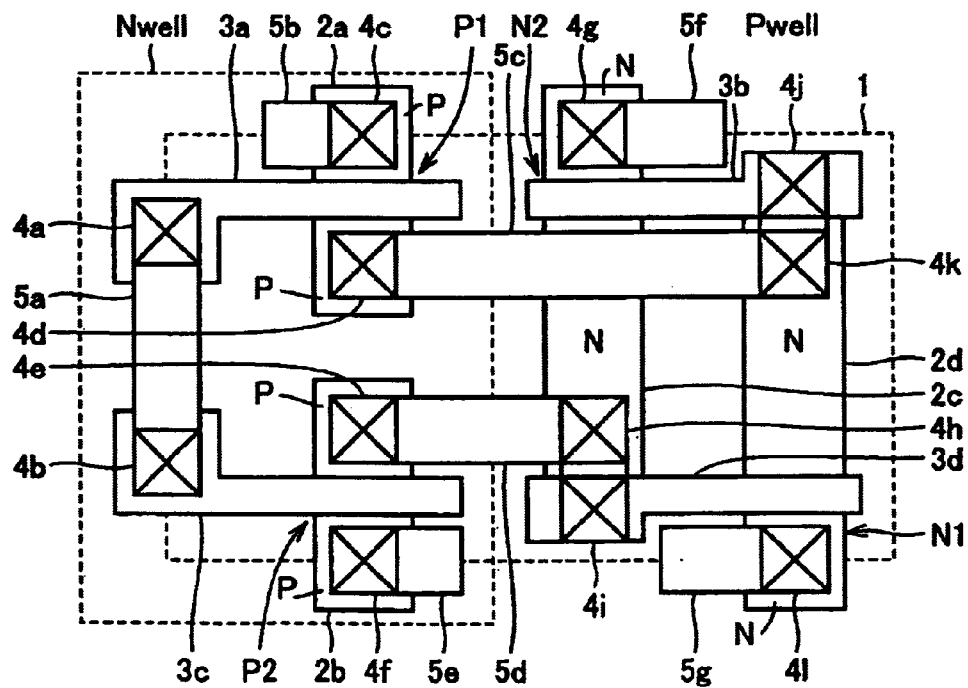
FIG. 2 shows a layout confutation of the memory cell shown in FIG. 1 up to first metal wirings.
Figure 3:
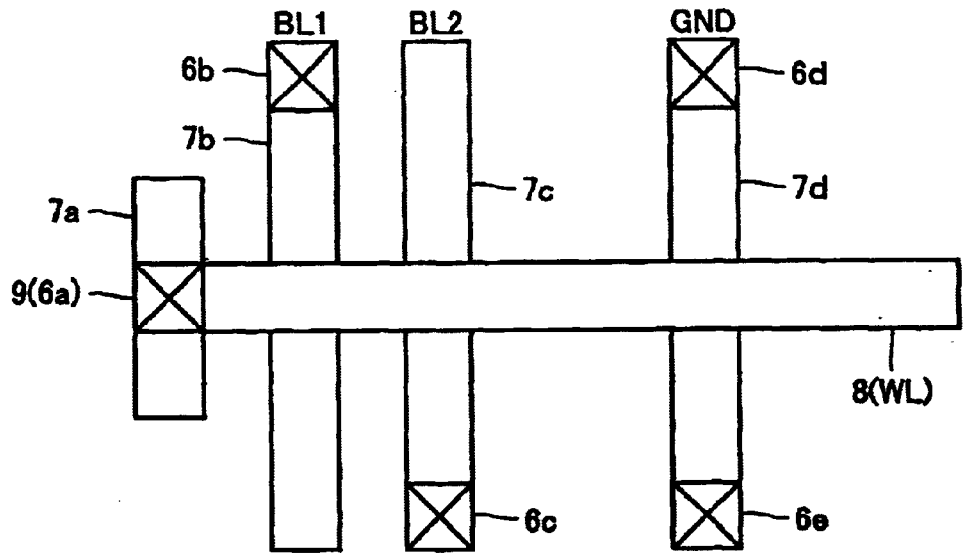
FIG. 3 shows a layout configuration of the memory cell shown in FIG. 1 up to second and third metal wirings.
Figure 12:
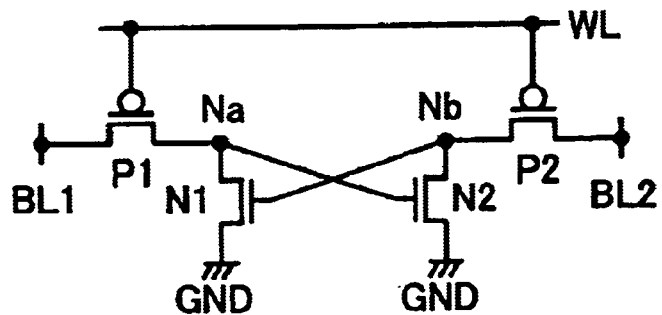
FIG. 12 is an equivalent circuit diagram of the non-load SRAM memory cell.

FIGS. 1 to 3 are plan views of memory cell 1 of a non-load SEAM (static semiconductor memory device) according to a first embodiment of the present invention. FIG. 12 is an equivalent circuit diagram of memory cell 1. FIG. 1 shows a layout configuration of memory cell 1 up to third metal wirings. FIG. 2 shows a layout configuration of memory cell 1 up to first metal wirings. FIG. 3 shows a layout configuration of memory cell 1 up to second and third metal wirings.

As shown in FIGS. 1 and 2, an N well region is formed adjacent a P well region. N-type impurities such as phosphorus are selectively injected into the P well region to thereby form active regions 2c and 2d including N-type diffusion regions. P-type impurities such as boron are selectively injected into the N well region to thereby form active regions 2a and 2b including P-type diffusion regions.

Active regions 2a to 2d are all formed linearly and extended in the same direction (in a direction in which the P and N well regions are extended, i.e., longitudinal direction). Therefore, the P-type diffusion regions and N-type diffusion regions which are included in active regions 2a to 2d and which become sources/drains of each of the MOS transistors are also extended in the longitudinal direction. By making the shapes of active regions 2a to 2d simple as described above, it is possible to decrease variations in the width and formation position of active regions 2a to 2b Memory cell 1 in the first embodiment is formed from four MOS transistors. Specifically, memory cell 1 is formed from first and second access PMOS transistors P1 and P2 and first and second driver NMOS transistors N1 and N2. First and second access PMOS traitors P1 and P2 are formed on the N well region, respectively, and first and second driver NMOS transistors N1 and N2 are formed on the P well region.

First access PMOS transistor P1 is formed in an intersection portion between active region 2a including P-type diffusion regions which become a source and a drain, respectively and polysilicon wiring 3a. Second access PMOS transistor P2 is formed in an intersection portion between active region 2b including P-type diffusion regions which become a source and a drain, and polysilicon wiring 3c.

First driver NMOS transistor N1 is formed in an intersection portion between active region 2d including N-type diffusion regions which become a source and a drain, and polysilicon wiring 3d Second driver NMOS transistor N2 is formed in an intersection portion between active region 2c including N-type diffusion regions which become a source and a drain, and polysilicon wiring 3b.

As shown in FIG. 1, polysilicon wirings 3a to 3d are extended in the same direction. That is, polysilicon wiring 3a to 3d are extended in a direction lateral direction in FIG. 1) perpendicular to a direction (longitudinal direction in FIG. 1) in which the P well region and the N well region are extended and in a direction in which the P well region and the N well region are aligned.

Thus, it is possible to decrease variations in the widths and formation positions of polysiicon wirings 3a to 3d Accordingly, even if polysiicon wirings 3a to 3d are formed to be deviated in the lateral direction in FIG. 1, it is possible to avoid short circuits between polysilicon wrings 3a to 3d and contact holes (contact sections) 4c to 4h, 4k and 4l.

A first interlayer insulating film, not shown, is formed to cover active regions 2a to 2d and polysilicon wirings 3a to 3d, and contact holes 4a to 4l which reach active regions 2a to 2d and polysilicon wirings 3a to 3d are formed in the first interlayer insulating film. A conductive layer for connection to an upper wiring is embedded into contact holes 4a to 4l. It is noted that contact holes 4a, 4b, 4i and 4j are gate contacts which reach gates and contact holes 4c, 4d, 4e, 4f, 4g, 4h, 4k and 4l are diffusion contacts which reach diffusion regions.

In FIG. 2, the N-type diffusion region which serves as the drain of first driver NMOS transistor N1 and the P-type diffusion region which serves as the drain of first access PMOS transistor P1 are connected to each other through contact hole 4k, a first metal wiring 5c and contact hole 4d at electrically low impedance. The terminal corresponds to a storage node Na in the equivalent circuit diagram shown in FIG. 12.

Likewise, the N-type diffusion region which serves as the drain of second driver NMOS traitor N2 and the P-type diffusion region which serves as the drain of second access PMOS transistor P2 are connected to each other through contact hole 4e, a first metal wiring 5d and contact hole 4h at electrically low impedance. The terminal corresponds to a storage node Nb in the equivalent circuit diagram shown in FIG. 12.

As shown in FIG. 2, first metal wiring 5c which forms storage node Na and first metal wiring 5d which forms storage node Nb are formed in parallel to each other. Further, first metal wirings 5c and 5d extend in the lateral direction which is the extension direction of word lines (WL).

First metal wirings 5a to 5g are formed on the first interlayer insulating film. First metal wiring 5a is formed on contact holes 4a and 4b. First metal wiring 5b is formed on contact hole 4c. First metal wiring 5c is formed on contact holes 4d, 4k and 4j. First metal wiring 5d is formed on contact holes 4e, 4h and 4i. First metal wiring 5e is formed on contact hole 4f First metal wiring 5f is formed on contact hole 4g. First metal wiring 5g is formed on contact hole 4l.

Next, with reference to FIG. 3) second metal wirings 7a to 7d are formed on first metal wirings 5a to 5g through a second interlayer insulating film which is not shown in the figure. Second metal wiring 7a is connected to first metal wiring 5a through a first via hole 6a formed in the second interlayer insulating film. Second metal wirings 7b and 7c are connected to first metal wirings 5b and 5e through first via holes 6b and 6c and become bit lines BL1 and BL2, respectively. Second metal wiring 7d is connected to first metal wirings 5f and 5g through first via holes 6d and 6e and becomes a ground line (GND line).

Apart of the N-type dif n regions in active regions 2c and 2d become source terminals of driver NMOS transistors N1 and N2, respectively and applied with a GND potential through contact holes (diffusion contacts) 4g and 4l, first metal wirings 5f and 5g and first via holes 6d and 6e.

A part of the P-type diffusion regions in active regions 2a and 2b become source terminals of access PMOS transistors P1 and P2 and connected to bit lines BL1 and BL2 through contact holes (diffusion contacts) 4c and 4f, first metal wirings 5b and 5e and first via holes 6b and 6c, respectively.

As shown in FIG. 2, the drain of first access PMOS transistor P1 is connected to the drain of first driver NMOS transistor N1 through first metal wiring 5c without interposing polysilicon wiring 3b (the gate of second driver NMOS transistor N2) therebetween. In addition, the drain of second access PMOS transistor P2 is connected to the drain of second driver NMOS transistor N2 through first metal wiring 5d without interposing polysilicon wiring 3d (the gate of fist driver NMOS transistor N1) therebetween. Therefore, it is possible to decrease the resistance of a path for pulling out a current to a bit line and to thereby shorten access time, i.e., to accelerate an SRAM.

Further, as shown in FIG. 3, bit lines BL1 and BL2 are extended in the longitudinal direction (short side direction) of memory cell 1, thereby making it possible to shorten bit lines BL1 and BL2. Thus, it is possible to decrease the wiring capacitance of each of bit lines BL1 and BL2. Besides, as shown in FIG. 3, since the distance between bit lines BL1 and BL2 can be widened, it is possible to decrease the capacitance between the bit lines. These also contribute to the acceleration of an SRAM.

A third metal wiring 8 is formed on second metal wirings 7a to 7d through a third interlayer insulating film which is not shown. Third metal wiring 8 becomes a word line (WL). Third metal wiring 8 extend in the direction in which the P well region and the N well region are aligned and in the direction (lateral direction in FIG. 3) perpendicular to the direction in which the respective well regions extend, and is electrically connected to second metal wiring 7a through a second via hole 9.

Second metal wiring 7a is electrically connected to polysilicon wirings (gate terminals) 3a and 3c through first via hole 6a, first metal wiring 5a and contact holes 4a and 4b. Therefore, polysilicon wirings 3a and 3c and third metal wiring (WL) 8 are electrically connected to one another.

By adopting the above described layout, it is possible to attain not only the advantage of shortening the access time of the SRAM but also the following advantages. Since the polysilicon wirings are arranged in the same direction, it is possible to facilitate controlling the dimensions of gates. In addition, the active regions and the diffusion regions are formed linearly. Due to this, even if the polysilicon wirings are shifted in the vertical direction in FIG. 2, it is possible to keep each gate width constant and to avoid changing the characteristics of the respective transistors.

Second Embodiment

Figure 4:
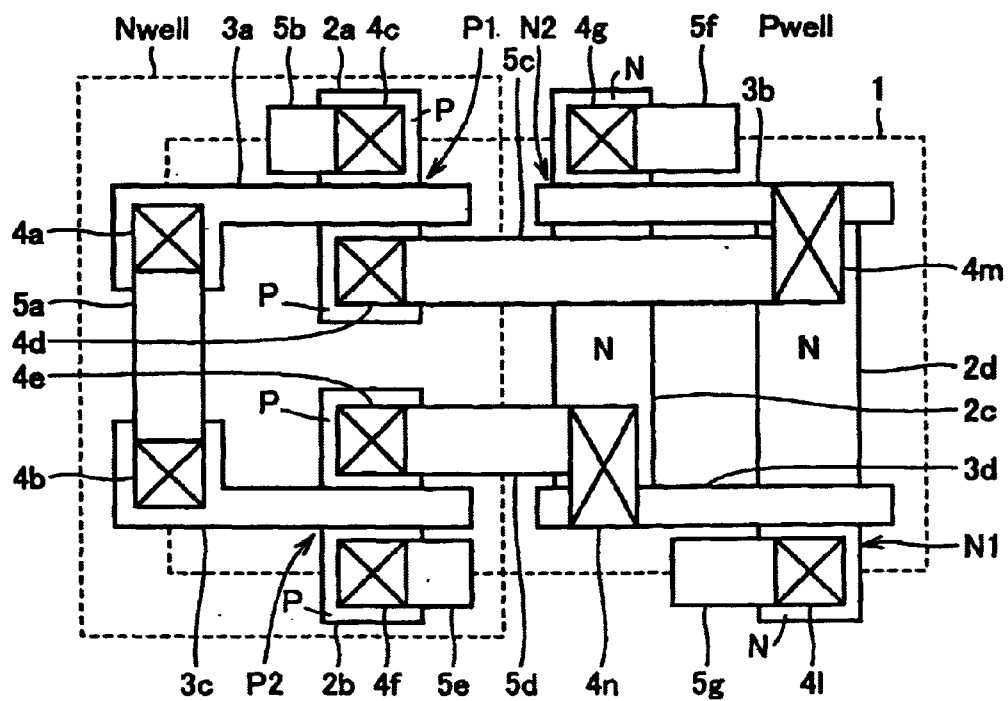
FIG. 4 shows a layout configuration of a non-load SRAM memory cell according to a second embodiment of the present invention.

A second embodiment of the present invention will next be described with reference to FIG. 4. FIG. 4 is a plan view showing the layout of memory cell 1 of SRAM according to the second embodiment. FIG. 4 shows the layout of memory cell 1 up to first metal wirings. It is noted that the equivalent circuit diagram of memory cell 1 in the second embodiment is the same as that in the first embodiment.

The main difference of the second embodiment from the first embodiment is that shared contacts each of which reaches a predetermined diffusion region and a predetermined polysilicon wiring are provided Specifically, contact holes 4j and 4k are integrated with each other to provide a contact hole 4m which reaches the drain of driver NMOS transistor N1 and polysilicon wiring 3b. Contact holes 4h and 4j are integrated with each other to provide a contact hole 4n which readies the drain of driver NMOS transistor N2 and polysilicon wiring 3d. The other constituent elements of memory cell 1 in the second embodiment are the same as those in the first embodiment. Therefore, the second embodiment can attain the same advantages as those of the first embodiment.

Figure 5:
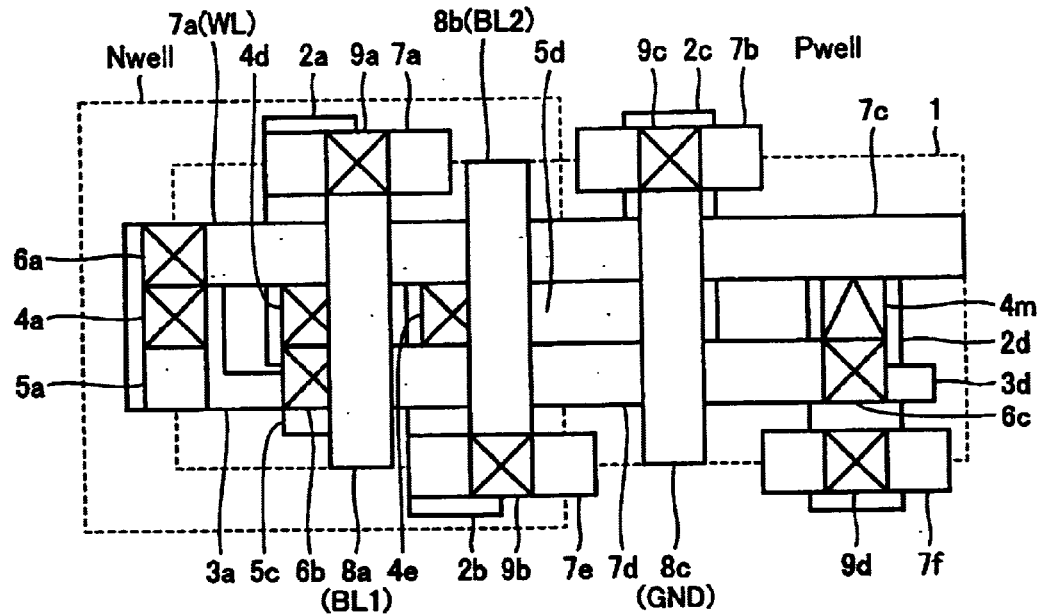
FIG. 5 shows a layout configuration of a non-load SRAM memory cell according to a third embodiment of the present invention.
Figure 6:
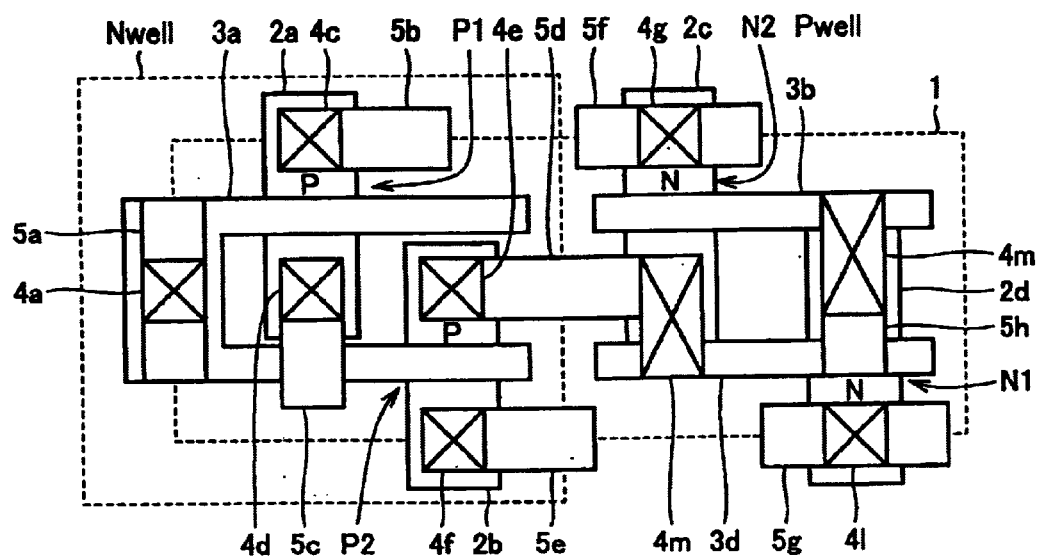
FIG. 6 shows a layout configuration of the memory cell shown in FIG. 5 up to first metal wirings.

The shared contact connects the diffusion region and the polysilicon wiring using one contact hole in common. Therefore, by employing the shared contacts, it is possible to decrease the number of contact holes, compared with that in the first embodiment It is, therefore, possible to expect an improvement in manufacturing yield Third Embodiment A third embodiment of the present invention will next be described with reference to FIGS. 5 and 6. FIGS. 5 and 6 show the layout of memory cell 1 of a non-load SRAM according to the third embodiment. FIG. 6 shows the layout of memory cell 1 up to third metal wirings. FIG. 6 shows the layout of memory call up to first metal wirings. The equivalent circuit diagram of memory cell 1 in the third embodiment is the same as that in the first embodiment.

In the third embodiment, as shown in FIGS. 5 and 6, shared polysilicon wiring 3a for forming the gates of first and second access PMOS transistors P1 and P2 is provided. More specify, U-shaped integral polysilicon wiring 3a is provided and the gates of first and second access PMOS transistors P1 and P2 are formed by a part of polysilicon wiring 3a.

In addition, first and second access PMOS transistor P1 and P2 are aligned not in the extension direction of bit lines but in the extension direction of word lines (WL). Further, active regions 2a and 2b are arranged to be deviated each other in the extension direction of bit lines. Due to this, active regions 2a and 2b have portions adjacent each other in the extension direction of word lines (WL). With this arrangement, it is possible to make the gates of first and second access PMOS transistors P1 and P2 closer to each other and to further reduce the length of memory cell 1 in the extension direction of bit lines. It is thereby possible to further reduce the length of each bit line.

Moreover, first metal wirings 5c and 5h are extended in the extension direction of bit lines as shown in FIG. 6, first via holes 6b and 6c are provided on metal wirings 5c and 5h, respectively as shown in FIG. 5 and second metal wiring 7d is provided on first via holes 6b and 6c as shown in FIG. 5. This second metal wiring 7d can electrically connect the drain of first access PMOS transistor P1 to that of first driver NMOS transistor N1.

As described above, by constituting second metal wiring 7d which forms one storage node Na out of the metal wiring on a different layer from a layer on which first metal wiring 5d which forms the other storage node Nb is formed, it is possible to easily add a desired capacitance between the storage nodes. In the third embodiment, second metal wiring 7d is located above first metal wiring 5d. It is, therefore, possible to form a capacitance between second metal wiring 7d and first metal wiring 5d. In addition, by overlapping second metal wiring 7d which is an upper layer wiring with first metal wiring 5d which is a lower layer wiring, it is possible to form the capacitance between second metal wiring 7d and first metal wiring 5d. In this case, by appropriately adjusting the overlapping amount between second metal wiring 7d and first metal wiring 5d, it is possible to control the added capacitance between the storage nodes.

As described above, by adding the desired capacitance between the storage nodes, it is possible to improve soft error resistance. The soft error means herein a phenomenon that a rays discharged from U and Th contained in a package pass through a silicon substrate to thereby generate noise caused by electron-hole pairs, and the noise causes information destruction to thereby malfunction a memory.

In the third embodiment, as shown in FIG. 5, second metal wirings 7a, 7b, 7e and 7f are formed on first metal wirings 5b, 5f, 5e and 5g, respectively and second metal wiring 7c which becomes a word line is arranged in parallel to second metal wiring 7d.

Further, as shown in FIG. 5, bit line BL1 is formed out of third metal wiring 8a, bit line BL2 is formed out of third metal wiring 8b and the GND line is formed out of third metal wiring 8c. Third metal wiring 8a is electrically connected to second metal wiring 7a through a second via hole 9a, third metal wiring 8b is electrically connected to second metal wiring 7e through a second via hole 9b, and third metal wiring 8c is electrically connected to second metal wiring 7b through a second via hole 9c. The other constituent dements of memory cell 1 in the third embodiment are basically the same as those in the second embodiment.

Fourth Embodiment

Figure 7:
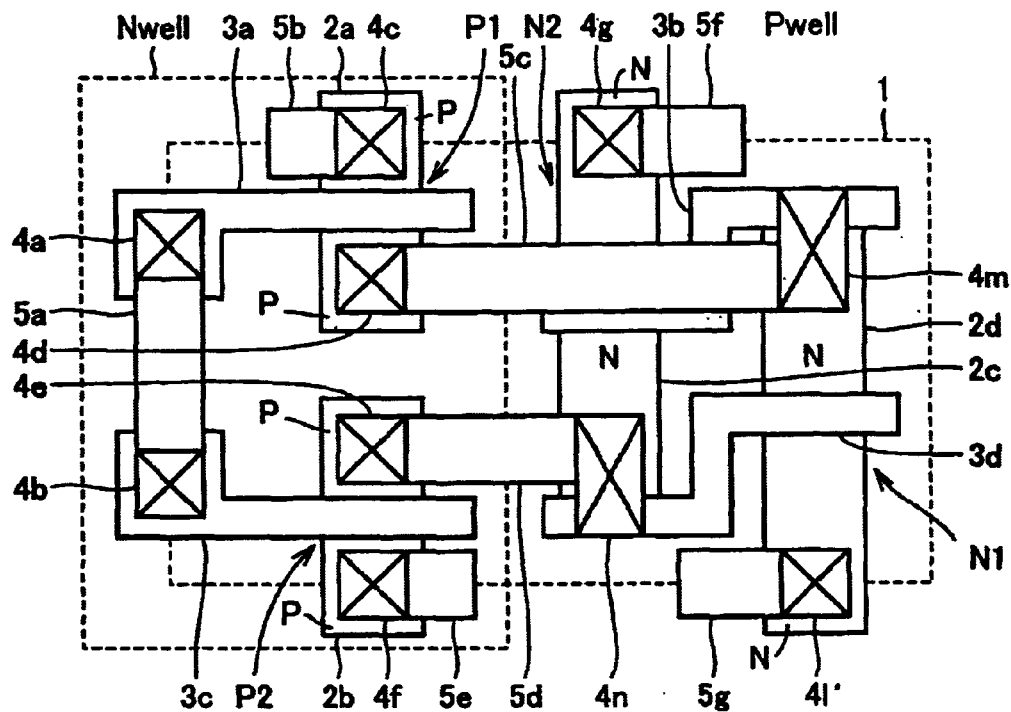
FIG. 7 shows a layout configuration of a non-load SRAM memory cell according to a fourth embodiment of the present invention.

A fourth embodiment of the present invention will next be described with reference to FIG. 7. FIG. 7 shows the layout of memory cell 1 of a non-load SRAM according to the fourth embodiment up to first metal wirings. The equivalent circuit diagram of memory cell 1 in the fourth embodiment is the same as that in the first embodiment.

In the fourth embodiment, as shown in FIG. 7, polysilicon wirings 3b and 3d for forming the gates of first and second driver NMOS transistors N1 and N2 are bent.

More specifically, polysilicon wiring 3b is bent between active regions 2c and 2d, a part of one end of polysilicon wiring 3b is arranged on a contact hole 4n side, i.e., toward the drain side of second driver NMOS transistor N2. Polysilicon wiring 3d is bent between active regions 2c and 2d, a part of one end of polysilicon wiring 3d is arranged on a contact hole 4m side, i.e., toward the drain side of first driver NMOS transistor N1. Since the other constituent elements of memory cell 1 in the fourth embodiment are the same as those in the second embodiment, the fourth embodiment can attain the same advantages as those of the second embodiment.

Further, by bending the polysilicon wirings as described above, it is possible to make the areas of the drains of first and second driver NMOS transistors N1 and N2 smaller than those of the sources of first and second driver NMOS transistors N1 and N2. Accordingly, it is possible to reduce the areas of the active regions of first and second driver NMOS trans N1 and N2. It is thereby possible to decrease the probability that a rays pass through the active regions of first and second driver NMOS transistors N1 and N2 and to improve soft error resistance.

Fifth Embodiment

Figure 8:
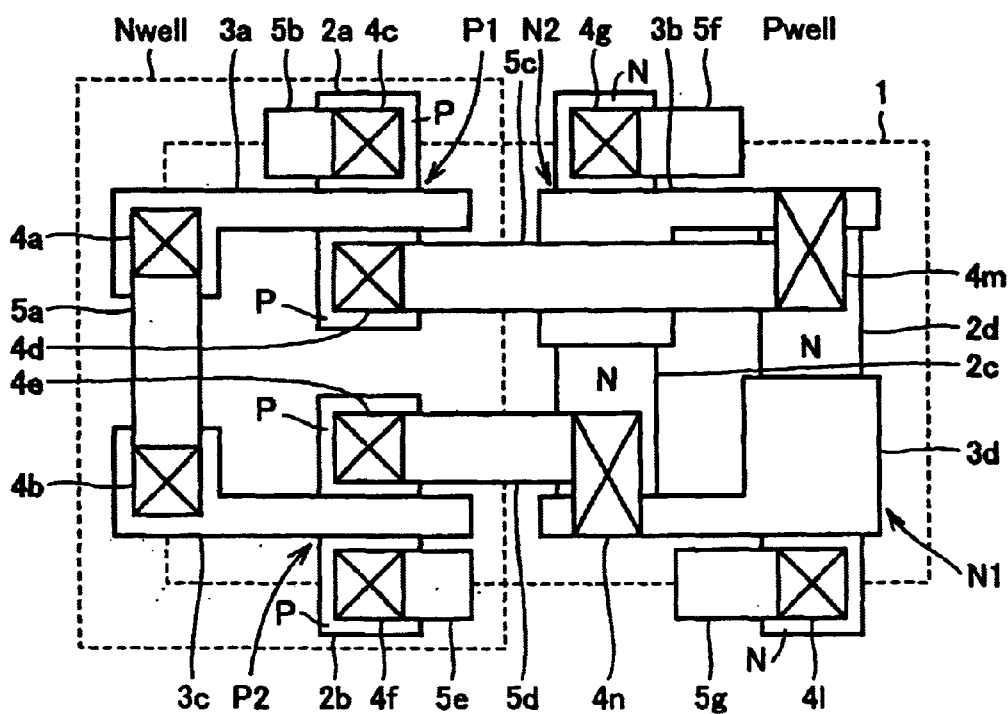
FIG. 8 shows a layout configuration of a non-load SRAM memory cell according to a fifth embodiment of the present invention.

A fifth embodiment of the present invention will next be described with reference to FIG. 8. FIG. 8 shows the layout of memory cell 1 of a non-load SRAM in the fifth embodiment up to first metal wirings. The equivalent circuit diagram of memory cell 1 in the fifth embodiment is the same as that in the first embodiment In the fifth embodiment, the gate lengths of first and second driver NMOS transistors N1 and N2 are made longer than those of first and second access PMOS transistors P1 and P2.

More specifically, the width of a portion of polysilicon wiring 3b located on active region 2c is locally expanded, thereby making the gate length of second driver NMOS transistor N2 longer than that of second access PMOS transistor P2. The width of a portion of polysilicon wiring 3d located on active region 2d is locally expanded, thereby making the gate length of first driver NMOS transistor N1 longer than that of first access PMOS transistor P1. Since the other constituent elements of memory cell 1 in the fifth embodiment are the same as those in the second embodiment, the fifth embodiment can attain the same advantages as those of the second embodiment.

Besides, by making the gate length of each driver MOS transistor longer than that of each access MOS transistor, it is possible to change the ratio of a leak current value ($I_{off}$) of the driver MOS transistor to that of the access MOS transistor when they are turned off and to thereby improve the H-level holding characteristic of memory cell 1.

The reasons that the fifth embodiment can attain the above advantages will be described. In FIG. 12, it is assumed that storage node Na is at L level and storage node Nb is at H level In a memory cell formed from four tranistors, storage node Nb is held at H level using the potential of precharged bit line BL2.

Second access PMOS transistor P2 is turned off when data is being held. Therefore, the potential of storage node Nb is determined by a leak current value ($I_{off-P}$) of second access PMOS transistor P2 when being turned off and a leak current value ($I_{off-N}$) of second driver NMOS transistor N2 when being turned off. To hold the H level, therefore, it is necessary to satisfy the relationship of $I_{off-P} > I_{off-N}$. Preferably, leak current value $I_{off-P}$ is not less than 100 times as high as leak current value $I_{off-N}$.

Considering this, the gate length of each driver MOS transistor is adjusted to thereby control the leak current value of the driver MOS transistor. Specifically, the gate length of second driver NMOS transistor N2 is made longer than that of second access PMOS transistor P2. Thereby, it is possible to make the leak current value $I_{off-N}$ lower than $I_{off-P}$ and to thereby improve the data "H" holding characteristic of memory cell 1.

Sixth Embodiment

Figure 9:
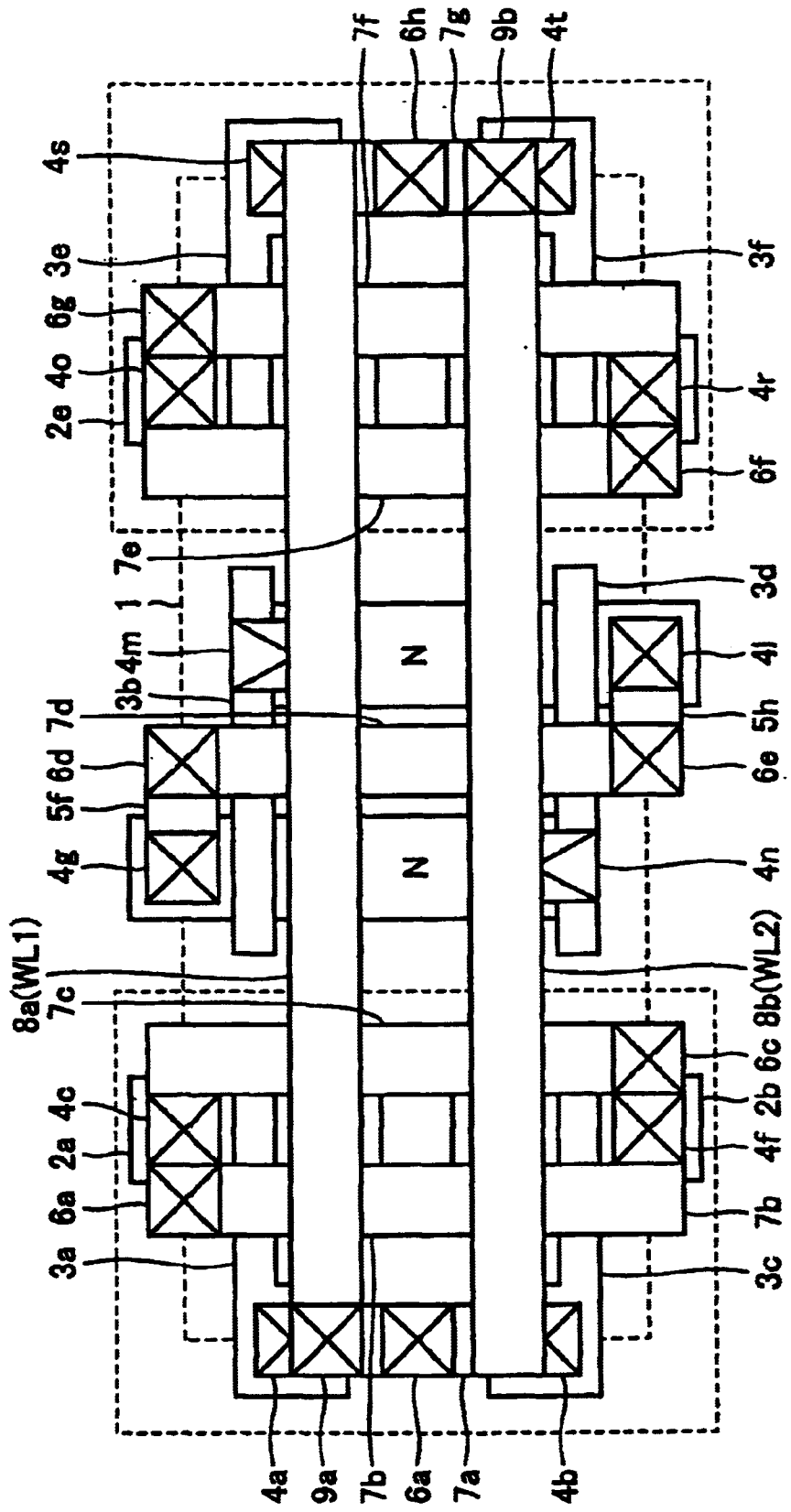
FIG. 9 shows a layout configuration of a non-load SIAM dual-port memory cell according to a sixth embodiment of the present invention.
Figure 10:
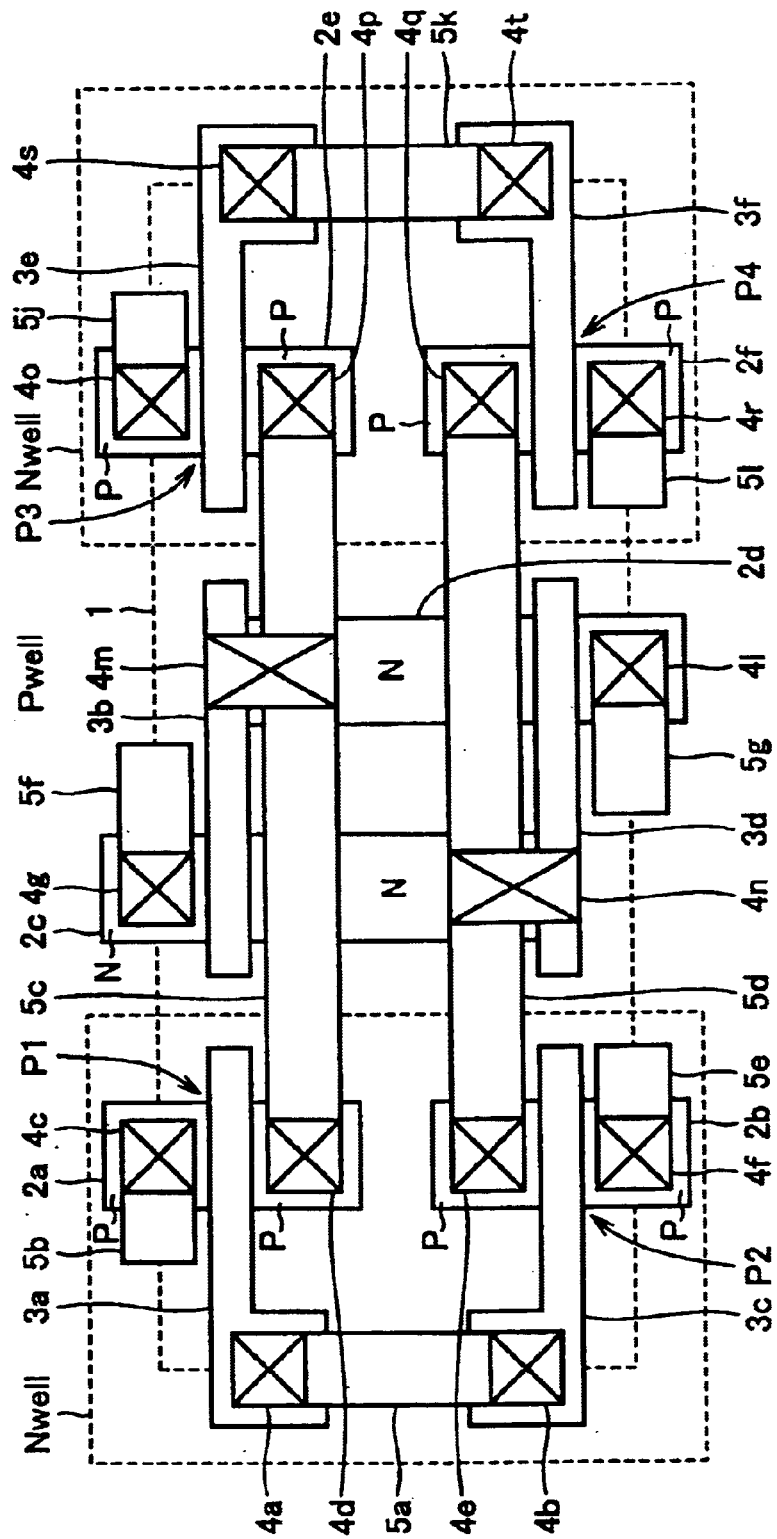
FIG. 10 shows a layout configuration of the memory cell shown in FIG. 9 up to first metal wirings.
Figure 11:
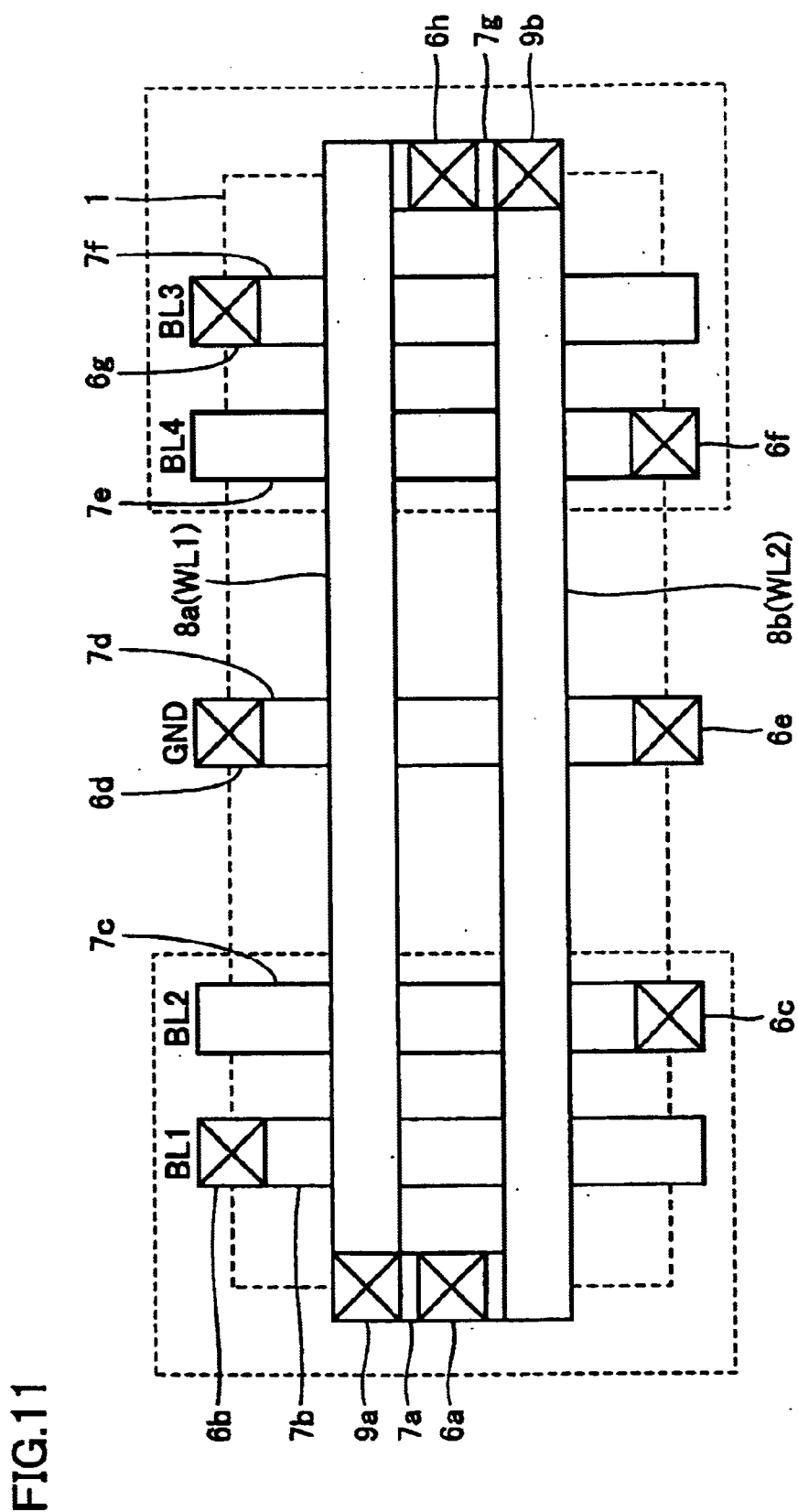
FIG. 11 shows a layout configuration of second and third metal wirings of the memory cell shown in FIG. 9.
Figure 13:
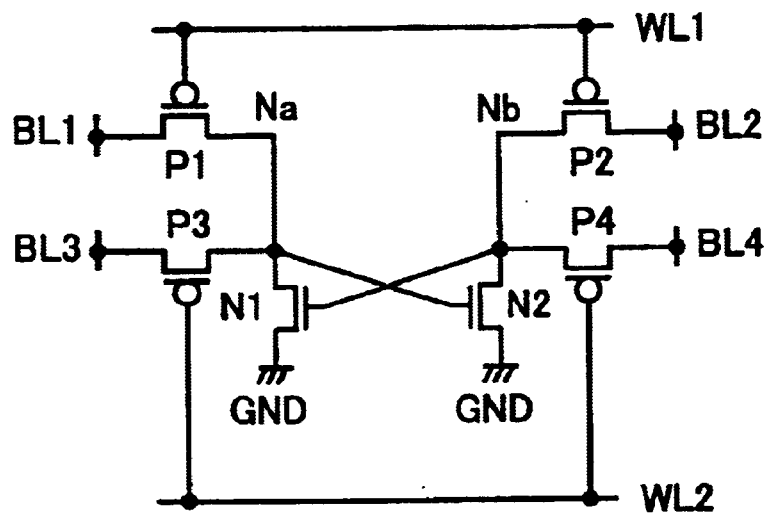
FIG. 13 is an equivalent circuit diagram of a non-load SRAM dual-port memory cell.
Figure 14:
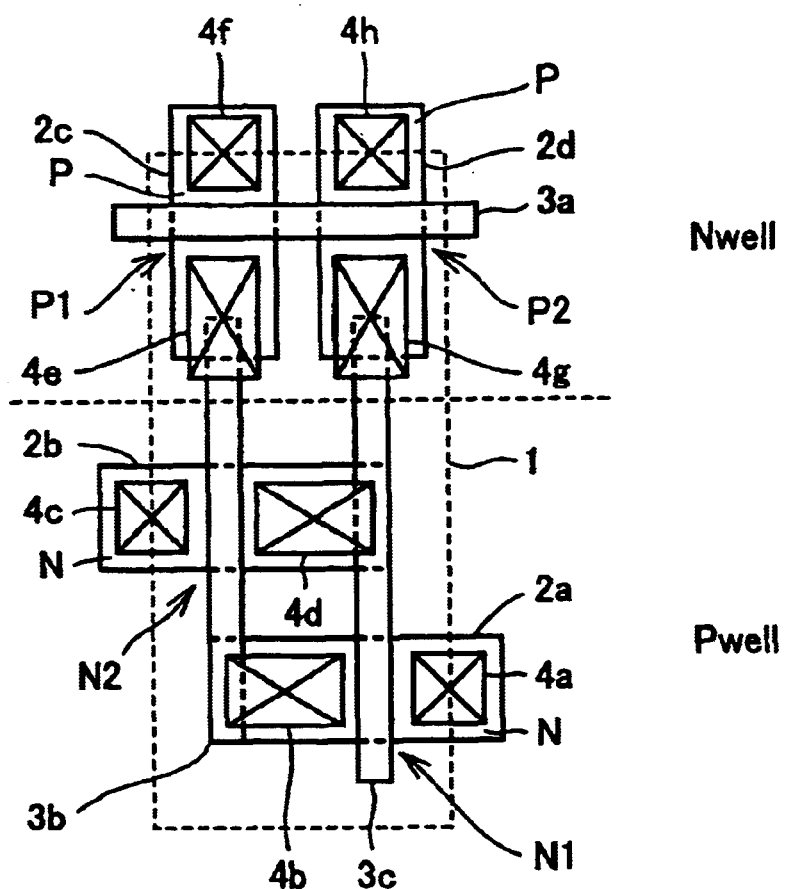
FIG. 14 shows a layout configuration of a conventional non-load SRAM memory cell.

A sixth embodiment of the present invention will next be described with reference to FIGS. 9 to 11. The sixth embodiment is an example of applying the present invention to a 2-port memory cell The equivalent circuit diagram of memory cell 1 is shown in FIG. 13. FIG. 9 shows the layout of memory cell 1 up to third metal wirings. FIG. 10 hows the layout of memory cell 1 up to first metal wirings. FIG. 11 shows the layout of second and third metal wirings.

As shown in FIG. 13, the important feature of sixth embodiment is in that third and fourth access PMOS transistors P3 and P4 are added to the memory cell in the second embodiment. Specifically, as shown in FIGS. 9 and 10, N well regions are provided on the both sides of a P well region, first and second access PMOS transistors P1 and P2 are arranged on one of the N well regions and third and fourth access PMOS transistors P3 and P4 are arranged on the other N well region.

On the right N well region, active regions 2e and 2f including P-type diffusion regions and polysilicon wirings 3e and 3f are formed. Third and fourth access PMOS transistors P3 and P4 are formed in the intersection portions between active regions 2e and 2f and polysilicon wirings 3e and 3f, respectively. Active regions 2e and 2f are formed linearly as in the case of the other access regions 2a to 2d and extend in the direction perpendicular to the direction in which the P well region and the N well regions are aligned Therefore, the P-type diffusion regions and N-type diffusion regions which become sources and drains also extend in the perpendicular direction to the direction in which the P well region and the N well regions are aligned. Polysilicon wirings 3e and 3f form the gates of third and fourth access PMOS transistors P3 and P4, and are extend in the direction in which the P well region and the N well regions are aligned as in the case of polysilicon wirings 3a to 3d.

As shown in FIG. 10, first metal wiring 5c is extended onto active region 2e and electrically connected to the drain of third access PMOS transistor P3 through a contact hole 4p. In addition, first metal wiring 5d is extended onto active region 2f and electrically connected to the drain of fourth access PMOS transistor P4 through a contact hole 4q. First metal wirings 5c and 5d extend in parallel to the word lines.

Further, first metal wirings 5j, 5k and 5l are formed on the right N well region. First metal wiring 5j is electrically connected to the source of third access PMOS transistor P3 through a contact hole 4o. First metal wiring 5l is electrically connected to the source of fourth access PMOS transistor P4 through a contact hole 4r. First metal wiring 5k is electrically connected to polysilicon wirings 3e and 3f through contact holes 4s and 4t.

As shown in FIG. 11, on the right N well region, second metal wirings 7e to 7g are formed. Second metal wiring 7f and 7e are electrically connected to first metal wirings 5j and 5l through first via holes 6g and 6f and become third and fourth bit lines BL3 and BL4, respectively. Second metal wiring 7g is electrically connected to first metal wiring 5k through a first via hole 6h. Bit lines BL1 and BL2 on the left N well region constitute a first port while bit lines BL3 and BL4 on the right N well region constitute a second port.

Third metal wirings 8a and 8b which become a pair of word lines (WL1 and WL2) are provided on second metal wirings 7a to 7g. Third metal wiring (WL1) 8a is electrically connected to polysilicon wirings 3a and 3c through second via hole 9a, second metal wiring 7a, first via hole 6a, first metal wiring 5a and contact holes 4a and 4b. Third metal wiring (WL2) 8b is electrically connected to polysilicon wirings 3e and 3f through second via hole 9b, second metal wiring 7g, first via hole 6h, first metal wiring 5k and contact holes 4s and 4t. The other constituent elements of memory cell 1 in the sixth embodiment are basically the same as those of memory cell 1 in the second embodiment.

As shown in FIG. 10, in the sixth embodiment, the drains of first and third access PMOS transistors P1 and P3 are connected to the drain of first driver NMOS transistor N1 through first metal wiring 5c without interposing polysilicon wiring 3b (the gate of second driver NMOS transistor N2) therebetween. In addition, the drains of second and fourth access PMOS transactor P2 and P4 are connected to the drain of second driver NMOS transistor N2 through first metal wiring 5d without interposing polysilicon wiring 3d (the gate of first driver NMOS transistor N1) therebetween. Therefore, it is possible to decrease the resistance of a path for pulling out a current to bit lines and to thereby shorten access time, i.e., to accelerate an SRAM Moreover, as shown in FIG. 11, bit lines BL1 to BL4 are extended in the longitudinal direction (short side direction) of memory cell 1, thereby making it possible to shorten the length of each of bit lines BL1 to BL4. Thereby, it is possible to decrease the wiring capacitance of each of bit lines BL1 to BL4. Besides, as shown in FIG. 11, since the distances among bit lines BL1 to BL4 can be widened, it is possible to decrease the capacitance among the bit lines. These can also contribute to the acceleration of an SRAM.

As described above, it is possible to attain not only the advantage of shortening the access time of the SRAM but also the following advantages. Since the polysilicon wirings are arranged in the same direction, it is possible to facilitate controlling the dimensions of gates. In addition, the active regions and the diffusion regions are formed linearly. Due to this, even if the polysilicon wings are shifted in the vertical direction in FIG. 1, it is possible to keep each gate width constant and to avoid changing the characteristics of the respective transistors.

Moreover, bit lines BL1 and BL2 which serves as the first port and bit lines BL3 and BL4 which serves as the second port can be arranged on the different N well regions to be away from each other. Therefore, it is possible to attain an advantage in that the interference between the ports hardly occurs. In the example shown in FIG. 11, the N well regions are provided on the both sides of the P well region, respectively, and bit lines BL1 and BL2 as the first port and bit lines BL3 and BL4 as the second port are arranged on the both sides of the GND line on the P well region, respectively, with a predetermined distance kept therebetween. Therefore, it is possible to suppress the interference between the ports more effectively.

If bit lines BL1 and BL2 as the first port are arranged adjacent bit lines BL3 and BL4 as the second port, memory cell 1 tends to be influenced by noise caused by coupling capacitance. This is because if the potential of one bit line changes from a VDD potential to a GND potential during a write operation, cross-talk noise caused by coupling capacitance is added to the other bit line adjacent the one bit line.

In a read operation, data is read by amplifying a small potential difference between a bit line pair using a sense amplifier. If a write operation is being performed on bit lines BL1 and BL2 as the first port and a read operation is being performed on bit lines BL3 and BL4 as the second port, then cross-talk noise may be added to bit lines BL3 and BL4 to thereby cause read error.

However, in the sixth embodiment, the bit lines as the first port are not adjacent the bit lines as the second port, so that the problem of the interference between the ports can be avoided.

While the embodiments of the present invention have been described so far, appropriate combinations of the features of the respective embodiments are originally intended. In addition, the present invention is applicable to not only non-load SRAM but also an SRAM having two load transistors as well as four tansistors, i.e., having a total of six transistors.

According to the present invention, it is possible to decrease the resistance of the path between the drain of an access MOS transistor and the drain of an driver MOS transistor, i.e., the current path between the bit line and the ground line. In addition, since it is possible to shorten the first and second bit lines and to secure a wide distance between the bit lines, it is possible to decrease the wiring capacitance of each bit line. It is thereby possible to accelerate an SRAM. Further, it is possible to decrease variations in the width and positions of formation patterns for gates or the like after photolithography and to allow each gate to be shifted in a longitudinal direction thereof to some extent. It is, therefore, possible to secure a margin for variations in gates and diffusion regions during formation.

If shared contact reaching the gates of driver MOS transistors and the drains of driver MOS transistors are provided, it is possible to decrease the number of contact sections and to improve manufacturing yield.

Further, if the first and second access MOS transistors are arranged to be aligned in the direction in which the word line is extended, it is possible to further reduce the length of the memory cell in the extension direction of the bit lines and to further shorten the length of each bit line in each memory cell.

If the second metal wiring is formed from a metal wring on a layer above the first metal wiring, it is possible to form a capacitance between the first and second metal wirings. A desired capacitance can be formed between the first and second metal wirings by, for example, overlapping the first metal wiring with the second metal wiring. It is thereby possible to form a desired capacitance between storage nodes and to improve soft-error resistance.

If an area of each of the drains of the first and second driver MOS transistors is made smaller than an area of each of the sources of the first and second driver MOS transistors, it is possible to decease the area of the active region of the driver MOS transistor. It is thereby possible to improve the soft-error resistance.

By bending the first and second wirings for forming the gates of the first and second driver MOS transistors, the gates of the first and second driver MOS transistors can be arranged toward the drain side of the first and second driver MOS transistors. It is thereby possible to make the area of the drain of each driver MOS transistor smaller than the area of the source of the driver MOS tractor and to attain the above described advantages.

If a gate length of each driver MOS transistor is made longer than a gate length of each access MOS transistors, it is possible to make the leak current of the driver MOS transistor when being turned off, lower than that of the access MOS transistor. It is thereby possible to improve the H-level holding characteristic, i.e., data holding characteristic of data.

If widths of the first and second wiring for forming the gates of the first and second driver MOS transistors are locally expanded, a gate length of each of the first and second driver MOS transistors can be made longer than a gate length of each of the first and second access MOS tansistors. It is possible to attain the above described advantages.

If the present invention is applied to an SRAM having 2-port memory cells, the same advantages as those described above can be expected. If the first and second bit lines are formed on the second well and the third and fourth bit lines are formed on the third well it is possible to decrease cross-talk noise caused by the coupling capacitance between the ports and to suppress the intense between the ports.

Although the present invention has been described and illustrated in detail, it is clearly understood that the same is byway of illustration and example only and is not to be taken by way of limitation, the spirit and scope of the present invention being limited only by the terms of the appended claims.

What is claimed is:

1. A static semiconductor memory device comprising:

first and second bit lines;

a word line;

first and second access MOS transistors of a first conductivity type, having sources connected to said first and second bit lines, respectively, and having gates connected to said word line in common; and first and second driver MOS transistors of a second conductivity type, different from said first conductivity type, having sources receiving a ground potential, having drains connected to drains of said first and second access MOS transistors, respectively, and having gates connected to the drains of said second and first access MOS transistors, respectively, wherein the drain of said first access MOS transistor is connected to the drain of said first driver MOS transistor using metal wiring without interposing a gate of said second driver MOS transistor therebetween, and the drain of said second access MOS transistor is connected to the drain of said second driver MOS transistor using metal wiring without interposing a gate of said first driver MOS transistor therebetween.

2. A static semiconductor memory device comprising:

first and second access MOS (Metal Oxide Semiconductor) transistors of a second conductivity type, in a first well of a first conductivity type;

first and second driver MOS transistors of the first conductivity type, in a second well of the second conductivity type;

a word line connected to gates of said first and second access MOS transistors, and extending in a first direction in which said first and second wells are aligned; and first and second bit lines connected to sources of said first and second access MOS transistors, respectively, and extending in a second direction perpendicular to the first direction, wherein first and second diffusion regions of the second conductivity type forming sources and drains of said first and second access MOS transistors extend in a third direction in which third and fourth diffusion regions of the first conductivity type forming sources and drains of said first and second driver MOS transistors extend, gates of said first and second access MOS transistors extend in a fourth direction as a direction in which gates of said first and second driver MOS transistors extend, and the drains of said first and second access MOS transistors are connected to the drains of said first and second driver MOS transistors using first and second metal wirings without interposing the gates of said first and second driver MOS transistors therebetween, respectively.

3. The static semiconductor memory device according to claim 2, including
- a first contact section reaching the gate of said first driver MOS transistor and the drain of said second driver MOS transistor is, and
- a second contact section reaching the gate of said second driver MOS transistor and the drain of said first driver MOS transistor is.

4. The static semiconductor memory device according to claim 2, wherein said first and second access MOS transistors are aligned in the first direction.

5. The static semiconductor memory device according to claim 2, wherein said second metal wiring is on a layer above said first metal wiring.

6. The static semiconductor memory device according to claim 2, wherein each of the drains of said first and second driver MOS transistors has a smaller area than each of the sources of said first and second driver MOS transistors.

7. The static semiconductor memory device according to claim 6, comprising first and second wirings forming the gates of said first and second driver MOS transistors, wherein said first and second wirings bend so that the gates of said first and second driver MOS transistors are arranged on a drain side of said first and second driver MOS transistors.

8. The static semiconductor memory device according to claim 2, wherein each of said first and second driver MOS transistors has a longer gate length than each of said first and second access MOS transistors.

9. The static semiconductor memory device according to claim 8, comprising first and second wirings forming the gates of said first and second driver MOS transistors, wherein widths of said first and second wirings expand so that the gate lengths of each of said first and second driver MOS transistors are longer than the gate lengths of each of said first and second access MOS transistors.

10. A static semiconductor memory device comprising:
- a first well of a second conductivity type, located between second and third wells of a first conductivity type;
- first and second access MOS (Metal Oxide Semiconductor) transistors of the second conductivity type, in said second well;
- first and second driver MOS transistors of the first conductivity type, in said first well;
- third and fourth access MOS transistors of the second conductivity type, in said third well;
- a first word line connected to gates of said first and second access MOS transistors, and extending in a first direction in which said first, second, and third wells are aligned;
- a second word line connected to gates of said third and fourth access MOS transistors, and extending in the first direction in which said first, second, and third wells are aligned;
- first and second bit lines connected to sources of said first and second access MOS transistors, respectively, and extending in a second direction perpendicular to the first direction; and
- third and fourth bit lines connected to sources of said third and fourth access MOS transistors, respectively, and extending in the second direction, wherein
  - first, second, third, and fourth diffusion regions of the second conductivity type, forming the sources and drains of said first, second, third, and fourth access MOS transistors, extend in a third direction in which fifth and sixth diffusion regions of the first conductivity type, forming sources and drains of said first and second driver MOS transistors, extend,
  - the gates of said first, second, third, and fourth access MOS transistors extend in a fourth direction in which gates of said first and second driver MOS transistors extend, and
  - the drains of said first, second, third, and fourth access MOS transistors are connected to the drains of said first and second driver MOS transistors using first and second metal wirings without interposing the gates of said first and second driver MOS transistors therebetween, respectively.

11. The static semiconductor memory device according to claim 10, wherein said first and second bit lines are located on said second well, and said third and fourth bit lines are located on said third well.

* * * * *